United States Patent [19]

Kahng et al.

[11] Patent Number: 6,047,117
[45] Date of Patent: Apr. 4, 2000

[54] DIFFUSION-BASED METHOD AND APPARATUS FOR DETERMINING CIRCUIT INTERCONNECT VOLTAGE RESPONSE

[75] Inventors: Andrew B. Kahng, Los Angeles; Sudhakar Muddu, Santa Clara, both of Calif.

[73] Assignee: The Regents of the University of California, Oakland, Calif.

[21] Appl. No.: 08/838,091

[22] Filed: Apr. 15, 1997

Related U.S. Application Data

[60] Provisional application No. 60/015,515, Apr. 16, 1996.

[51] Int. Cl.$^7$ ...................................................... G06G 7/48
[52] U.S. Cl. ...................................... 395/500.34; 257/275
[58] Field of Search .................................... 364/488, 489, 364/490, 491, 578

[56] References Cited

U.S. PATENT DOCUMENTS 5,652,761  7/1997  Battersby ................................ 364/578

Primary Examiner—Kevin J. Teska
Assistant Examiner—Thuan Do
Attorney, Agent, or Firm—Daniel L. Dawes

[57] ABSTRACT

Disclosed is a diffusion-equation-based method of determining the time-domain response of an IC interconnect to an input voltage signal. Time-dependent voltage response determinations are accomplished analytically in the Laplace domain, with appropriate boundary conditions, treating the voltage response as a superposition of transmitted and reflected diffusions, based on parasitics as known quantities per unit length. The voltage response is thus determined by summing distinct reflected diffusions originating at both sides of the interconnect. The analysis proceeds on the assumption that only a selected small number of reflective components—normally only four—are required for sufficient accuracy. Voltage response from a sequence of interconnects is determined by treating the voltage response from the first interconnect as the input to the second, and repeating such looping with successive interconnects. A final inverse transform may be accomplished to express the response in the time domain. The method is limited to implementation on a computer, and an appropriately programmed computer comprises the apparatus of the invention.

10 Claims, 2 Drawing Sheets

DIFFUSION-BASED METHOD AND APPARATUS FOR DETERMINING CIRCUIT INTERCONNECT VOLTAGE RESPONSE

CROSS-REFERENCE TO PRIOR APPLICATIONS

This is a continuation-in-part of a provisional patent application (hereinafter referred to as the "Provisional Application"), Serial No. 60/015,515, entitled "Diffusion-Based Simulation of Voltage Response on Interconnects", filed on Apr. 16, 1996 in the name of the identical inventors as identified in respect to the present application and assigned to the same entity as is the assignee of the present application and of any patents issuing hereon.

BACKGROUND OF THE INVENTION

1. Field of the Invention

This invention relates to the field of VLSI (very large scale integration) circuit design, and particularly to methods and apparatus for determining the voltage response as a function of time, at a remote terminal within such a circuit, using a known voltage input.

2. Description of Prior Art

VLSI circuit chips are today commonplace in microprocessors and the like. They are designed by teams of engineers who, presented with a particular requirement, analytically design the proposed chip and prepare a layout drawing. The latter macroscopically presents the extremely complex pattern of components and interconnects which, when photo-etched, doped and deposited onto the silicon matrix, will collectively constitute the finished chip, which may include millions of microscopic components, all interconnected according to the design.

The sequence of manufacturing steps required to produce such a VLSI chip in quantity can easily be correspondingly complex. Thus, from initial design to setup of the manufacturing line, introduction of a new VLSI chip is an extremely expensive process, and not to be initiated lightly.

A major technical consideration underlying any new chip design is the maximum clock frequency at which the chip will operate in situ. If the frequency must, for the particular application, be greater than that at which a chip according to the particular design can operate, failure of the chip to function properly—or literal failure of the chip—can be the result.

It is important, therefore, in the process of designing a new chip or in implementing its manufacture, to determine, if possible, the maximum clock frequency at which the chip will operate. Obviously, if the maximum operating frequency can be determined at the analytical design point, before a significant investment in the manufacturing line has been made, a great deal of money can be saved by redesign, if the chip, when manufactured, will not operate properly at the frequency required. And even if, at a subsequent point in the process, the design must be altered—or even abandoned and replaced with an entirely new approach—this might ultimately prove to be a prudent investment.

Additionally, although such cost savings can be easily appreciated in respect to a VLSI chip with millions of components and interconnects, the potential savings which can thus be realized in the case of even a relatively simple IC, incorporating only thousands of components, can likewise be quite significant.

Accordingly, it is necessary to determine, at the preliminary design phase, if possible, the extent to which the proposed chip—of whatever level of complexity—can be driven at or above the required clock frequency. This requires analysis of the time delay—from selected input to selected output points—of a signal input to the chip. I.e., it is necessary to determine the voltage response as a function of time.

The source of considerable transmission delay are the interconnects, themselves. Although it would be ideal if interconnects were loss-free—i.e., totally devoid of impedance—this is, unfortunately, not the case in the real world. Each interconnect does, in fact, demonstrate a degree of resistance, capacitance and (to a considerably lesser degree) inductance. While such impedance might be almost negligible in a single interconnect, even an extremely small value will have a significant effect on the maximum response speed of the circuit. Collectively, the delay caused by possibly millions of such interconnects will have a profound effect on reducing the maximum operating frequency.

As mentioned in the Provisional Application, the methods which have previously been applied to determine voltage response characteristics of IC interconnects as functions of time fall into three categories: (a) segment-based simulation; (b) pure time-domain response computation and (c) analysis in a transform domain.

An example of the first is the URC simulation method, described therein, which conceptually divides an interconnect of given length into a finite sequence of segments, each having determinable values of the principal parasitics (i.e., resistance (R) and capacitance (C)) per unit length. The resulting equivalent circuit is then simulated to obtain signal response in the time domain.

As discussed in the Provisional Application, another pure time-domain method has been applied to the very special case of a step input to a finite, open-ended (i.e., infinite) load RC line. And even this solution is obtained by application of the questionable assumption that voltage response, as a function of position and time, is separable into time-dependent and position-dependent functions.

The problem is that even in the simplest source and load impedance cases, and with the application of often-unwarranted assumptions, computations of voltage response purely in the time domain involve very difficult, numerical solutions of complex differential and integral equations. However, applying the above third category solution, i.e., by transforming the problem out of the time domain—particularly, by transform into the Laplace domain—these differential and integral equations become considerably more straightforward linear equations, which are solvable in closed form. Once the solution is found, it can be returned to the time domain by a single inverse Laplace transform.

The first step in the prior art expression of this latter approach has been to calculate an approximation of the transfer function applicable to the input signal, which can then be employed to determine the transform-domain (and, thus, the time-domain) voltage response at the selected output point. But such a transfer function can only be determined and used in a few very simple cases.

What is needed, then, is a method of determining voltage response through a finite RC line, which can be performed analytically—i.e., in closed form, by transformation outside the time domain—with only a single inverse transformation into the time domain for the ultimate determination of voltage response as a function of time, which can be employed in a realistic range of source and load impedances.

BRIEF SUMMARY OF THE INVENTION

By the method of the present invention, time delay determinations are accomplished analytically, in Laplace space, where the input at a given point is expressed as the Laplace transform of the actual input signal. By solution of diffusion equations in the Laplace domain, with appropriate boundary conditions, treating the voltage response as a superposition of transmitted and reflected diffusions and the parasitics as known quantities per unit length, the Laplace domain output signal may be converted to a time function of voltage by final inverse Laplace transform. The voltage response is thus determined by summing distinct reflected diffusions originating at both ends of the interconnect, and the analysis proceeds on the basis that only a small number of reflected components are required to provide an accurate result.

Each successive circuit element (i.e., electronic component or interconnect) in the geometric design is dealt with by means of a loop in the analysis sequence, where the input to the next element is the output from the preceding element.

While there might, theoretically, be other possible implementations of the method of the present invention, it is here limited to computer implementation.

DETAILED DESCRIPTION OF THE PREFERRED EMBODIMENTS

Diffusion equations are partial differential equations which describe the propagation of certain idealized physical quantities through certain idealized physical media. Thus, the diffusion equations can analytically determine the relative output (as a function of time, etc.) at a given point in such an idealized medium, responsive to a specified input, where the physical nature of the medium and the boundary conditions are specified. By applying reasonable assumptions, very close approximations to real world effects can be arrived at.

In order to describe those approximations, and the diffusion-based method inherent in the present invention, the entire text of the Provisional Application is hereby fully incorporated at this point, for frequent specific reference hereinbelow.

Figure 1:
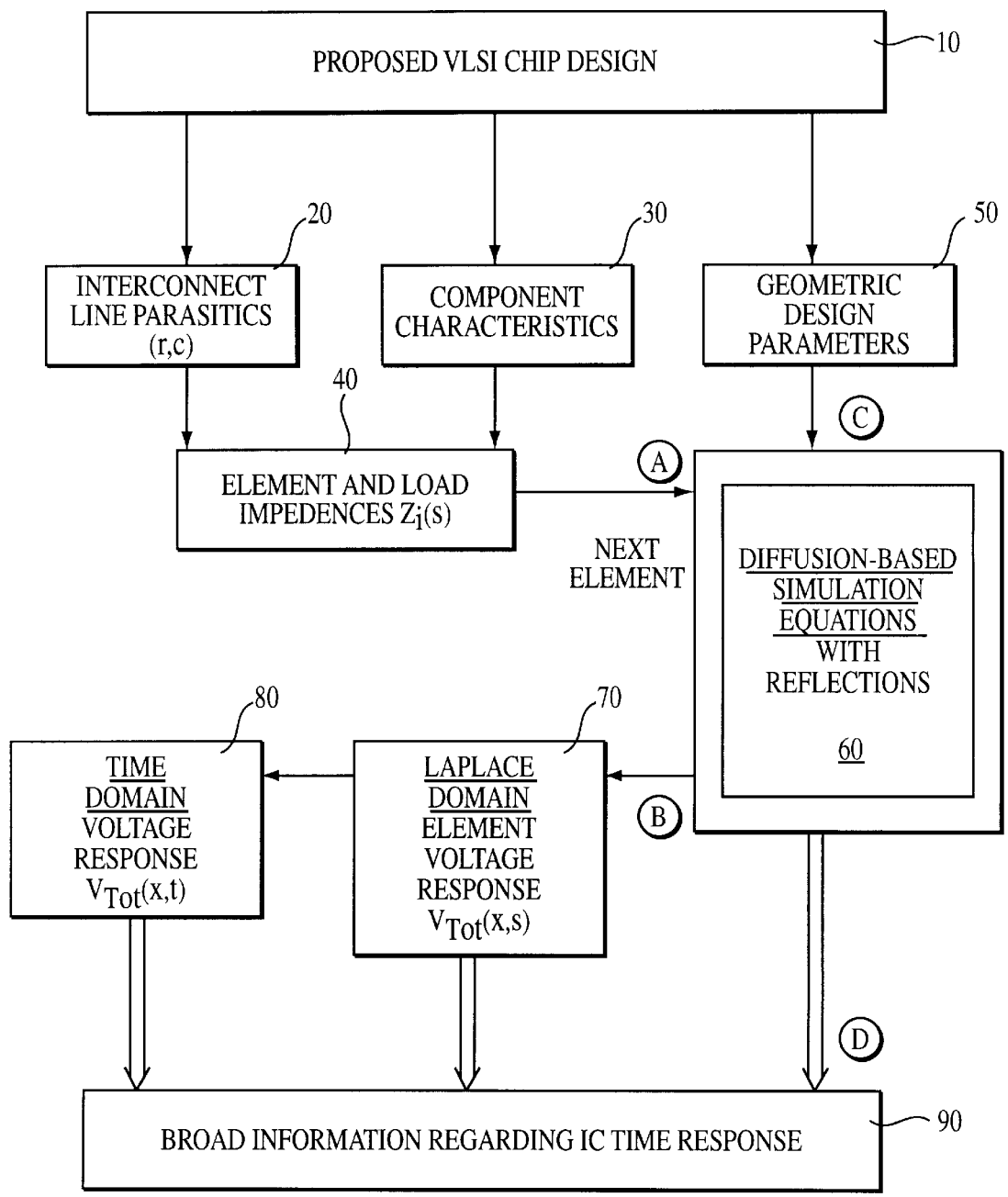
FIG. 1 is a block diagram of the various steps in the process.

As shown in FIG. 1 of the present application, the ultimate input to the diffusion-based analysis is the proposed chip design, itself—i.e., the geometry of the components and interconnects. In order to provide the proper coefficients and relationships for the diffusion equations, the individual characteristics—specifically, the major parasitics (resistance and capacitance)—of each element must be known or reasonably estimated.

The interconnect line parasitics 20 can be approximated by the assumption that resistivity and capacitance per unit length—which can be determined from ordinary tables—will be uniform. This is reasonable, since modem deposition methods are sufficiently sophisticated to virtually assure such consistency.

Likewise, the component characteristics 30—their individual resistance and capacitance—can be determined with equivalent precision.

Thus, the element and load impedance 40, at an input point can be determined. This constitutes the first data input A to the analytic determination 60. Of course, this first data input A represents and inputs only those characteristics of the impedance at a specific input junction, including only a single interconnect and a component (or a few components). Obviously, the determination of response voltage as a function of time must ultimately be made for the entire IC, or a specific portion of the IC. So the geometric design parameters 50—i.e., the nature and relative placement of the array of components and their respective interconnects (including the length thereof)—forms the second data input C to the analytic determination 60.

The nature of the analysis performed by the analytic determination 60 will be described, below, largely in reference to the incorporated Provisional Application. Suffice to say, at this juncture, that the output B from the analytic determination 60 is the relative voltage response, in reference to the signal input to that one junction, comprising only that one interconnect and its associated component(s)—in the Laplace domain—i.e., the Laplace response 70.

If that were the only interconnect under investigation, or the last in the series, then the Laplace response 70 could, by inverse transform, be easily converted—by a single numerical integration—to the time-domain voltage response 80. But either the Laplace response 70 or the time-domain response 80 or, indeed, the direct output D from the analysis 60, configured in some other convenient manner, does provide at least a datum of IC time response information 90 for further study or analysis.

However, there may, of course, be many other interconnects to analyze. Therefore, a loop is provided by which the output B from the analytic determination 60 (i.e., the Laplace response), is input, together with the element and load impedance 40 of the next interconnect, for further analytic determination 60.

This loop likewise evaluates the next output and the next, and so on, until the ultimate Laplace response 70 is converted to a time-domain voltage response function by inverse transformation.

It should be noted that, by the method of the present invention, only one numerical integration is required—when the final voltage response as a function of time is determined. Due to the analytic basis for our method, which includes provision of analytic expressions for step and ramp inputs, even the required intermediate numerical evaluations are reduced in quantity and complexity.

This is in stark contrast to the prior methods, wherein each increment of each interconnect must be numerically analyzed, since there, all determinations of voltage response are made in the time domain—i.e., as a function of time—or else analysis proceeds in the Laplace domain by use of a transform function which is quite difficult to determine, except in the most trivial cases.

Having described the overall nature of the various steps in the process of ultimately determining voltage response as a function of time at a selected output point, attention will now be drawn to the nature of the analytic determination 60, which forms the core of the method of the present invention.

For this, heavy reference will be made to the incorporated Provisional Application, and redundancy will be avoided by mere reference to portions of the text thereof, rather than repetition, or even substantial paraphrase, of the discussion therein set forth.

As stated on page 5 of the Provisional Application, the analysis proceeds on the basis of a general recursive equation which is derived by the following steps:

1. The expression for the time-domain response of a semi-infinite RC line is obtained for a step or ramp input (any possible input being merely a superposed series of such inputs), by solving the diffusion equation with boundary conditions applicable to those simple cases. This yields an expression with only one diffusion component, which is the voltage response of the semi-infinite line.

2. Using this derived expression, a general expression is obtained for an RC line with general load and source impedances by summing distinct diffusions originating at either end of the line, as a series of reflections, noting our discovery—confirmed by comparison with results from other methods (see, especially, Tables 1 and 2 in the Provisional Application)—that only a relatively small number of reflections need be considered, as higher order reflections do not materially contribute to the result.

3. Finally, based on the latter expression and assumption, a general recursive equation is derived from that general RC line expression, by which the input to each successive component may be determined and applied.

Analysis, in the Laplace domain, based on the latter equation and the input data forms the basis of the analytic determination 60.

Figure 2:
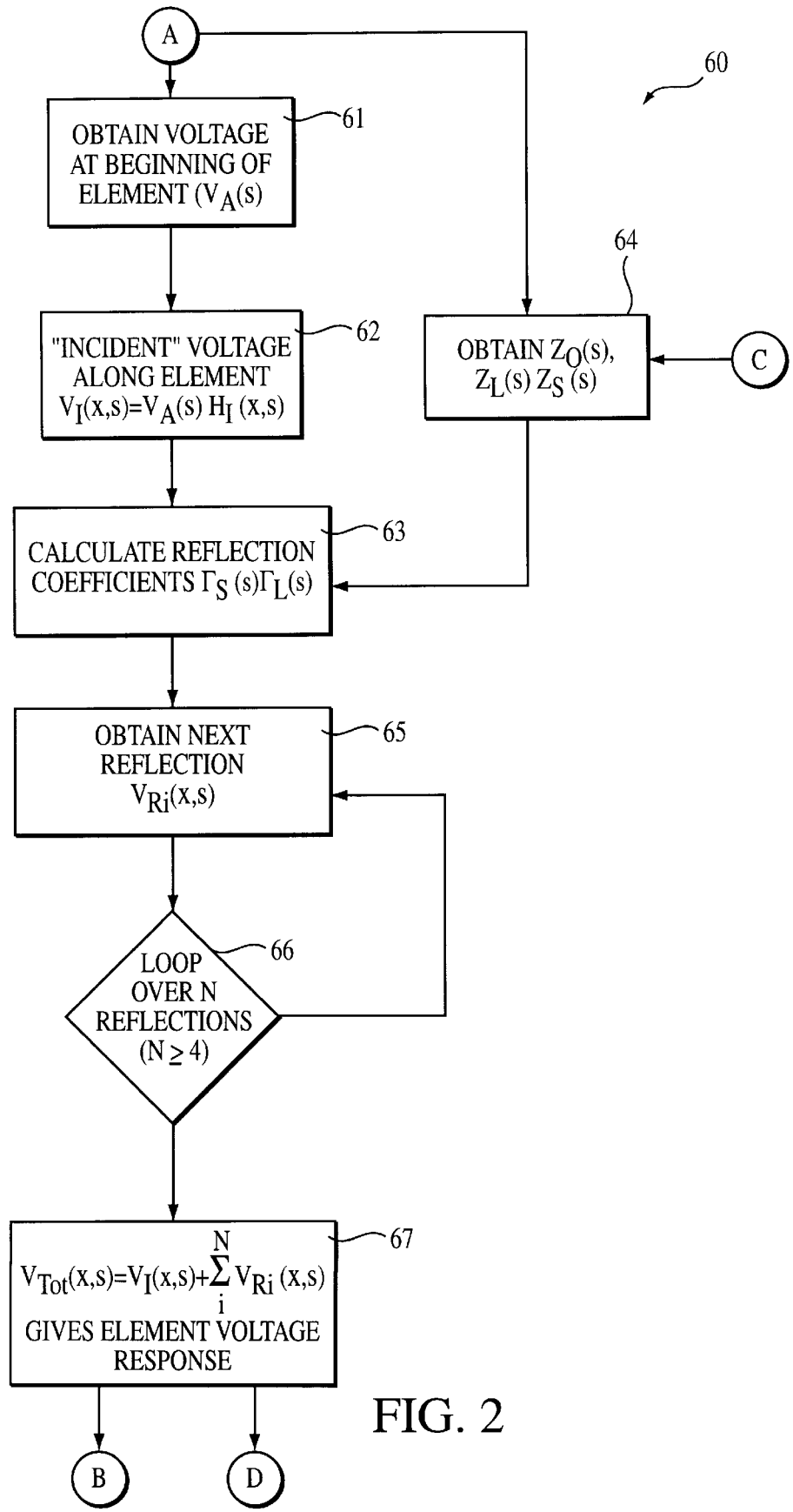
FIG. 2 is a flow chart of the diffusion-based analysis step.
Figure 1:
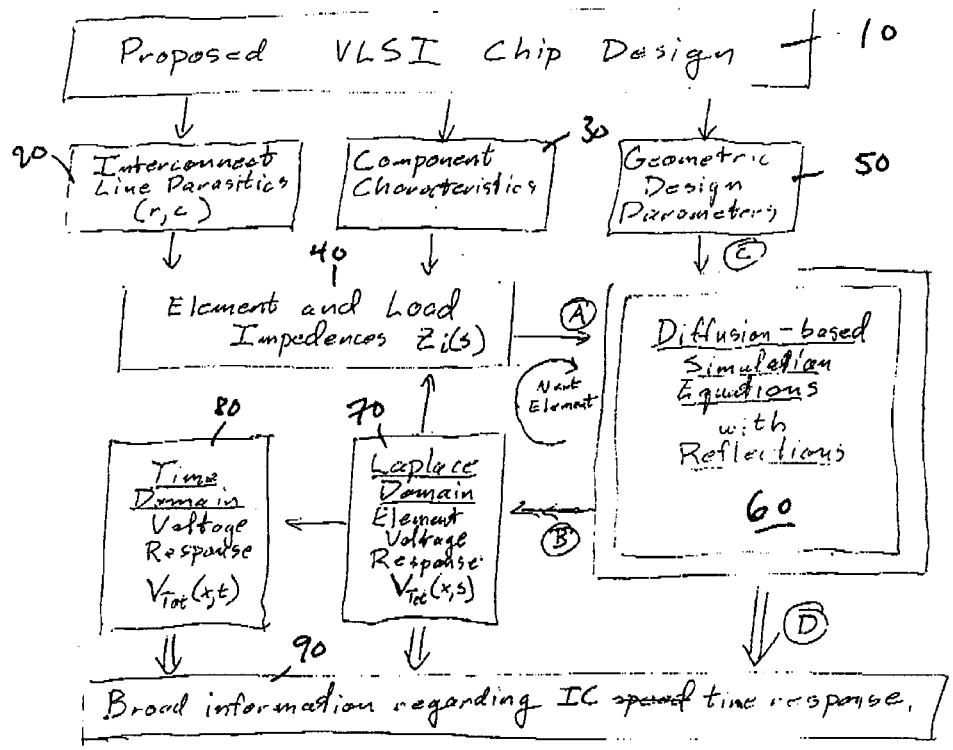
Figure 2:
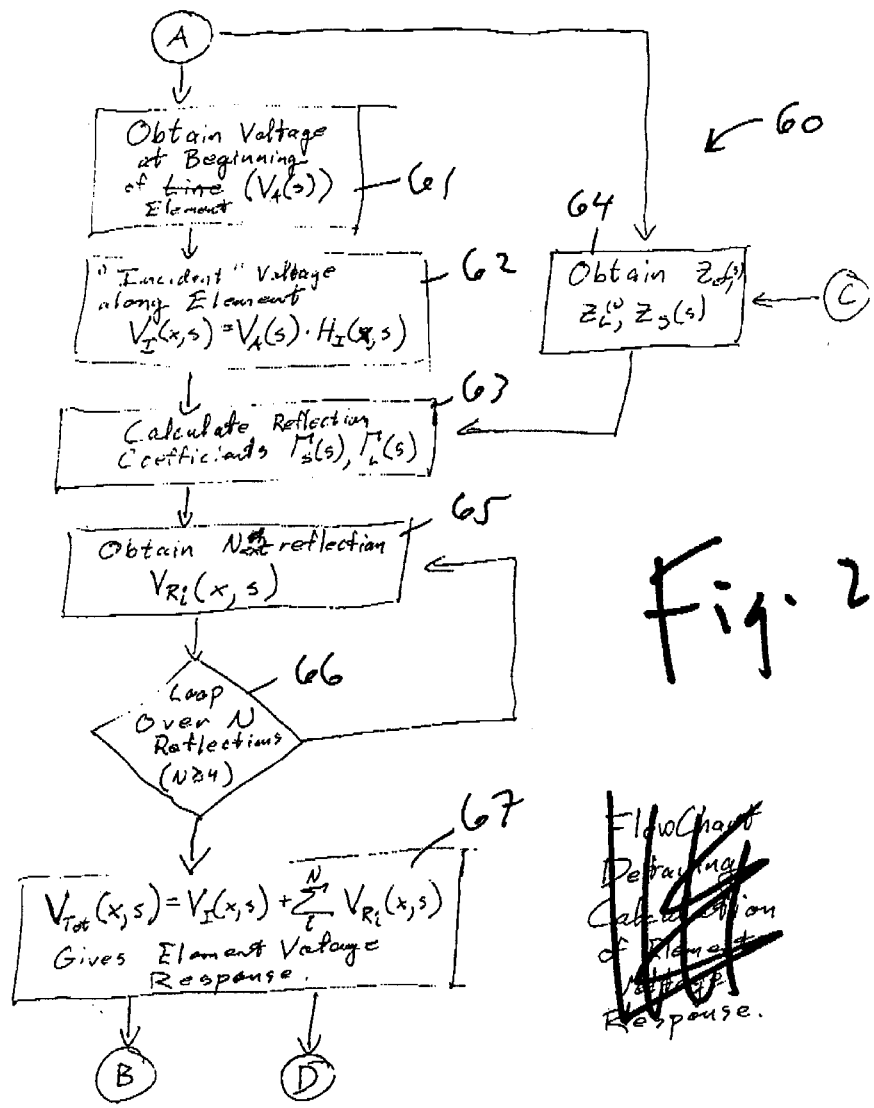

Referring first to FIG. 2 in the present application, the latter analytic determination 60 comprises a number of steps.

First, a source voltage determination 61 must be made. This is simply the voltage response at the end of the previous element (if any) or the known applied voltage (at the initial element). This voltage is expressed in the Laplace domain.

The next step is an incident voltage determination 62—i.e., a determination, in the Laplace domain, of the incident voltage at a given point within the interconnect, without taking into account any reflections. This is determined by multiplying the source voltage by the transfer function, derived for the semi-infinite RC line.

Next, is a reflection coefficient determination 63, which is, initially, a determination of the first order reflection coefficient due to an impedance discontinuity between elements. This determination requires input of the source and load impedances (which are known) and a determination of the impedance of particular element being analyzed—provided by an impedance determination 64.

A first order reflection determination 65 is then made at that point, based on the output from the reflection coefficient determination 63 and the incident voltage.

This determination is looped through a higher order reflection loop 66, to determine the reflected component for each higher order desired. Again, we have found that only up to fourth order reflections need be considered to provide sufficient accuracy. Therefore, only three further determinations need be made through the loop 66.

Having now obtained all required net reflection determinations, the summed output from the loop 66 provides, to the final step, the net voltage response at a given point within the interconnect. The output from this voltage response determination 67 is, in fact, the output from the entire analytic determination 60, as mentioned above.

As pointed out in the Provisional Application, the expressions derived therein, in the generalized form which constitutes the basis of the method herein described and claimed, are based on the fact that all input signals can be simulated by superposition of step and ramp functions, and that the impedance discontinuities at any junction (e.g., from an interconnect to another interconnect and/or to any electronic component(s)) can be determined and simulated by the procedures described in the Provisional Application. Likewise, the reflection coefficients at any such junction of interconnects, each of known composition and impedance values, can likewise be determined and applied to the general recursive equations set forth therein.

Computer implementation of the method hereinabove briefly described, and more rigorously set forth in the Provisional Application, is believed to be well within the capability of a reasonably skilled computer programmer, in the light of FIGS. 1 and 2 herein, and the teachings herein and in the Provisional Application.

Although the determination of voltage response, as a function of time, may be made within a wide and useful range of boundary conditions, according to the teachings herein and in the Provisional Application, these calculations are still rather complex. It is believed, therefore, that such determinations—and practice of the invention claimed herein—will, as a practical matter, be limited to calculations generated by a computer which has been programmed as suggested. Accordingly, application of the method of the present invention—and the claims herein—are expressly limited to computer implementation.

It is readily conceded that the flow charts presented herein as FIGS. 1 and 2 could, by a computer programmer of reasonable skill, in reliance on the teachings herein and in the Provisional Application, be altered in various ways to express the sequence of steps in carrying out the method of the invention—without departing from the spirit and substance of the invention. It is suggested, therefore, that those seeking to practice the invention should feel free to generate a flow chart, or flow charts, which differ from those herein presented, as a prelude to preparation of a computer program designed to carry out the method according to these teachings.

These modifications are merely suggested as illustrating the fact that many further alterations and modifications may be made by those having ordinary skill in the art without departing from the spirit and scope of the invention. Therefore, it must be understood that the illustrated and described embodiment has been set forth only for the purpose of example and that these should not be taken as limiting the invention as defined by the claims which follow.

The words used in this Specification to describe the invention and its various embodiments are to be understood not only in the sense of their commonly defined meanings, but also to include, by special definition in this Specification, structures, materials or acts beyond the scope of the commonly defined meanings. Thus if an term can be understood in the context of this Specification as including more than one meaning, then its use in a claim must be understood ad being generic to all possible meanings supported by the Specification and by the word itself.

The definitions of the words or limitations of the following claims, therefore, include not only the combination of limitations which are literally set forth, but all equivalent structures, materials or acts for performing substantially the same function in substantially the same way to obtain substantially the same result.

Insubstantial departures from the claimed subject matter as viewed by a person with ordinary skill in the art, now known or later devised, are expressly contemplated as being equivalently within the scope of the claims, even though not performing exactly the same function in substantially the same way to obtain substantially the same result. Therefore, substitutions now or later known to one with ordinary skill in the art will be within the scope of the defined limitations.

The claims are thus understood to include what is specifically illustrated and described above, what is conceptually equivalent, what can be obviously substituted and also what essentially incorporates the essential idea of the invention.

Background of the Invention

1 Field of the Invention

The present invention relates to the simulation of voltage response for lossy interconnect lines. This is a fundamental step in both the design and the manufacture of electronic systems. Of particular interest is that the present invention affords a new diffusion-based methodology for achieving the simulation. The present invention allows derivation of expressions for the voltage response, such that simulation becomes very efficient.

2 Review of Prior Art

The computation of voltage response in the time domain for distributed lossy interconnect lines is widely discussed in the literature. Previous methods for computing voltage response for a lossy distributed line (e.g., an $RC$ line) can be classified into three categories: (i) Segment-based Simulation, (ii) Pure Time-domain Response Computation, and (iii) Standard Transform Domain Approach.

2.1 Segment-based Simulation Method

In general, an interconnect line has associated values of parasitics such as resistance ($R$), capacitance ($C$) and inductance ($L$). A *segment representation* of an interconnect line uses *segments* (typically Π, $L$ or $T$ segments) which each lump a portion of the total line parasitics. Ideally, any distributed interconnect line can be represented using an infinite number of segments. However, in practice only a finite number of segments can be used.

For example, the simulation method SPICE (see "SPICE3 Version 33 User's Manual", B. Johnson et al., *University of California, Berkeley*, April 1991) uses a URC (Uniform distributed $RC$) segment model for simulating distributed $RC$ lines. A resulting equivalent circuit is then simulated to obtain the voltage response in the time domain.

Other techniques which also use a segment-based representation for an interconnect are:

- Asymptotic Waveform Evaluation (AWE), "AWE Asymptotic Waveform Evaluation for Timing Analysis", L.T. Pillage and R.A. Rohrer, *IEEE Trans. on CAD*, April 1990, pp. 352-366, which is a general technique for estimating the time-domain response of linear(ized) $RLC$ circuits.

- Rapid Interconnect Circuit Evaluator (RICE), "RICE: Rapid Interconnect Circuit Evaluation Using AWE", C.L. Ratzlaff and L.T. Pillage, *IEEE Tras. on CAD*, June 1994, pp. 764-776, which extends AWE to handle efficiently $RLC$ interconnects.

- Reciprocal expansion (REX), "Fast Approximation of the Transient Response of Lossy Transmission Line Trees", M. Sriram and S.M. Kang, *Proc. ACM/IEEE Design Automation Conf.*, June 1993, pp. 691-696, which was developed specifically for tree-like interconnect structures.

2.2 Pure Time-domain Response Computation

A solution of the finite $RC$ line voltage response, for a step input only, directly in the time-domain was first given by "Tapered Distributed Filters", W.M. Kaufman and S.J. Garrett, *IRE Transactions on Circuit Theory*, Dec. 1962, pp. 329-336. However, this solution is obtained only for a special case of an open-ended line, i.e., the load at the end of the line is assumed to be infinite. Also, the technique obtains a voltage response only by making the simplifying assumption $v(x, t) = f(x) \cdot g(t)$, i.e., that the voltage response is separable into functions of position and time. This simplifying assumption allows a solution to be obtained, but is not generally true.

2.3 Standard Transform Domain Approach

The computation of voltage response purely in the time-domain involves both the solution of differential equations and integrations; these are difficult to solve (and many assumptions may be required) even for very special cases of source and load impedances. By transforming the problem to a transform domain (in particular, the Laplace transform domain), the differential and integral equations will be reduced to linear equations. After obtaining the response in the transform domain, the time-domain response can be obtained by inverse transformation. This has been the standard approach for deriving expressions for the voltage response in distributed interconnect lines.

The first step in the standard approach is to calculate the transfer function; then, by approximately the transfer function both transform-domain and time-domain responses are obtained. This approach can extend to calculate the response only for very simply cases such as an infinite load, a short circuit load, a perfectly matched loan or a pure capacitive load; see "Open-Ended *RC* Line Model Predicts MOSFET IC Response", A. Wilnai, Dec. 15, 1971, pp. 53-54, "The Modeling of Resistive Interconnects for Integrated Circuits", R.J. Antinone and G.W. Brown, *IEEE J. Solid-State Circuits* 18, April 1983, pp. 200-203, "Time-Domain Analysis and Measurement Techniques for Distributed *RC* Structures. II. Impulse Measurement Techniques", R.C. Peirson and E.C. Bertnolli, *J. App. Physics*, June 1969, pp. 118-122. "Behavior of a Single Transmission Line Stimulated With a Step Function", H.L. Mattes, *manuscript*, Aug. 1993, "A General Methodology for Response and Delay Computations in VLSI Interconnects", A.B. Kahng and S. Muddu, *UCLA CS Dept. TR-940015*, March 1994, and "Delay Analysis of the Distributed *RC* Line", V.B. Rao, *Proc. ACM/IEEE Design Automation Conf.*, June 1995, pp. 370-375.

Summary of the Invention

The present invention gives a new technique for simulating the time-domain response for a finite lossy distributed interconnect structure. This structure can be stimulated with either a step input or ramp input, implying that since any input can be expressed as the sum of various ramp input segments shifted in time, our method applies to any input waveform. Our technique is based on treating the voltage response as a superposition of reflected and/or transmitted voltage *diffusions*. Using our technique, we are able to analytically obtain the transient time-domain response of a finite *RC* line for different cases of source and load impedances. Our method is efficient and the accuracy of the solution depends on a flexible, user-determined degree of complexity applied to generate the analytical solution.

The next section gives the Technical basis of the Invention:

1. We first obtain the time-domain response of a semi-infinite *RC* line for both step and ramp inputs by solving the diffusion equation with appropriate boundary conditions. The total response for the semi-infinite line consists of only one diffusion component.

2. We then provide a general approach to compute the time-domain response for finite *RC* lines with general load and source impedances by summing distinct diffusions starting at either end of the line; each of these can be viewed as traveling either forward or backward along the line, in analogy with reflections.

In the limit, this approach gives an exact analysis, but only a few reflection components are needed in practice to achieve accurate response computations.

3. Finally, we present a general recursive equation for computing the higher order diffusion components due to reflections at source and loan end. Our method is simple and can be extended to response computations in arbitrary interconnection trees by modeling both reflection and transmission coefficients at discontinuities. Using our new techniques we can obtain new analytical expressions that have never previously been obtainable using previous methods. These include expressions for the time-domain voltage response under step and ramp input for an open-ended finite $RC$ line, and for a finite $RC$ line with resistive source and capacitive load. Sections 4 and 5 demonstrate the technical foundations of the invention by describing voltage response under step and ramp inputs.

3 Technical Basis of the Invention

3.1 Semi-Invinite $RC$ Line Analysis

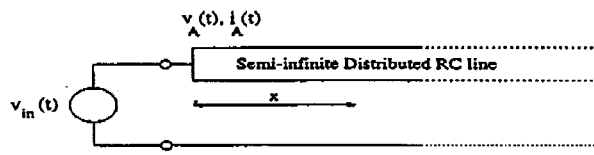

Figure 1: A semi-infinite distributed $RC$ line, and position $x$ along the line. $V_a(t)$ represents the voltage at the left port of the interconnect line.

The voltage and current on a distribted RC line as governed by the diffusion equation.

Consider the semi-infinite distributed RC line shown in Figure 1. The governing PDEs are $$\frac{\partial i(x,t)}{\partial x} = -c(x)\frac{\partial v(x,t)}{\partial t}$$
$$\frac{\partial v(x,t)}{\partial x} = -r(x)i(x,t)$$

Where *r(x)* and *c(x)* are resistance and capacitance per unit length. In a uniform wire, *r(x) = r* and *c(x) = c* are constants and we obtain the diffusion equation $$rc\frac{\partial v}{\partial t} = \frac{\partial^2 v}{\partial x^2}$$

which can be solved by restricting to solutions of form $v(\frac{x}{\sqrt{t}})$ using the substitution variable $\eta = x\sqrt{\frac{rc}{2t}}$. The general solution is (see "Delay Analysis of VLSI Interconnections Using the Diffusion Equation Model," A.B. Kahng and S. Muddu, *Proc. ACM/IEEE Design Automation Conf.*, June 1994, pp. 563-569)

$$v(\eta) = C_1 \int_0^\eta e^{-\frac{\eta^2}{4}}d\eta + C_2$$

The initial and boundary conditions for the semi-infinite line are

IC: $v(x,0) = 0$ for all $x \geq 0$
BC1: $v(0,t) = v_A(t)$ for all $t \geq 0$ and the initial condition that the line is quiet at $t = 0$ implies $C_1 = -\sqrt{\frac{2}{\pi}}C_2$.

With an ideal source and a step input $(V_{in}(s) = \frac{V_o}{s})$, the voltage at the front end of the line is $v(0,t) = v_{in}(t) = V_o u(t)$, i.e., at position $x = 0$ the voltage is constant and equal to $V_o$ for all $t > 0$ and $u(t)$ represents a unit step function. Using this condition in Equation (1) yields $$V_0 = C_1 \int_0^{\eta = x\sqrt{\frac{rc}{4t}} = 0} e^{-\frac{x^2}{4}} dx + C_2$$

from which $C2 = VO$ and $$v_I(x,t) = v(\eta) = V_0[1 - erf(\frac{\eta}{\sqrt{2}})] = V_0 \, erfc\left(x\sqrt{\frac{rc}{4t}}\right).$$

where error function is defined as $erf(x) = *$ and the complementary error function is $erfc(x) = 1 - erf(x)$. Below we will use the fact that the transform domain analog of Equation (3) is $$V_I(x,s) = \frac{V_0}{s} \cdot e^{-x\sqrt{rcs}}$$

and that for a general input at the front end of the line $V_A(s)$ the response is $$V_I(x,s) = V_A(s) \cdot e^{-x\sqrt{rcs}} = V_A(s) \cdot H_I(s)$$

where $H_I(s)$ corresponds to the transfer function of the semi-infinite line.

3.2 Analysis of Discontinuities

An actual distributed transmission line is finite in length, implying a change of impedance at the end of the line. The discontinuity at the end of the line could be due to another distributed line of different impedance, or due to a load impedance. These mismatches of impedance cause the voltage on the line to change according to proper reflections.

Consider the arrival of an incident voltage and current $V_I(s)$, $I_I(s)$ at a junction between two distributed $RC$ lines of different impedances, as shown in Figure 2. Portions of this voltage

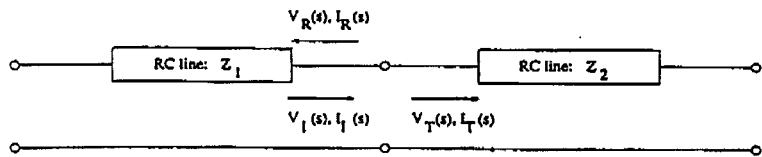

Figure 2: Connection of two $RC$ lines showing incident and transmitted components at the junction.

and current ($V_T(s)$, ($I_T(s)$), are transmitted to the second line, while ($V_R(s)$, ($I_R(s)$), are reflected back to the first line. From continuity of voltage across the junction, ($V_I(s)$) + ($V_R(s)$) = ($V_T(s)$), and conservation of charge yields ($I_I(s)$) + ($I_R(s)$) = ($I_T(s)$). The incident, transmitted, and reflected voltages satisfy the conditions $$V_I(s) = Z_1 I_I(s) \qquad V_T(s) = Z_2 I_T(s) \qquad V_R(s) = Z_1 I_R(s)$$

where $Z_1$ and $Z_2$ are the characteristic impedances of the first and second lines. Using the above equations and solving for the transmitted and reflected voltages in terms of the incident voltage, we have $$V_T(s) = V_I(s) \frac{2Z_2}{Z_2 + Z_1}$$
$$V_R(s) = V_I(s) \frac{Z_2 - Z_1}{Z_2 + Z_1}$$

From these equations, the reflection coefficient at the discontinuity is defined as $$\Gamma = \frac{Z_2 - Z_1}{Z_2 + Z_1}$$

and the transmission coefficient is $(1 + \Gamma)$. The concepts of reflect and transmitted voltages apply at any discontinuity. For typical semiconductor device interconnections, discontinuities at the end of the line are due to capacitive load, and those at the source are due to a resistive driver.

3.3 General Solution for Finite Distributed *RC* line with Source and Load Impedances For a general finite *RC* line with source and load impedance as shown in Figure 3, the incident propagation of voltage in the transform domain can be obtained as $$V_I(x,s) = V_A(s)e^{-\sqrt{R_x C_x s}}$$

The voltage at the front end of the line (i.e., at A) is $$V_A(s) = V_{in}(s) \cdot \frac{Z_0}{Z_0 + Z_S} = V_{in}(s) \cdot \frac{(1 - \Gamma_S(s))}{2}$$

where $\Gamma_S(s)$ is the the reflection coefficient at the source. So, the incident voltage on the line is $$V_I(x,s) = V_{in}(s)\frac{(1 - \Gamma_S(s))}{2}e^{-\sqrt{R_x C_x s}}$$

The time-domain expression of the incident diffusion component can be obtained by taking the inverse transform of the above equation.

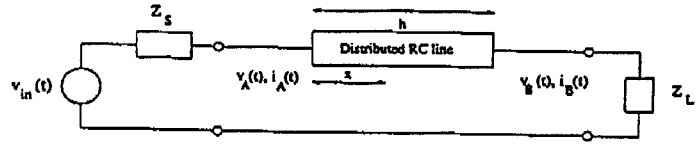

Figure 3: A distributed $RC$ line of length $h$, and position $x$ along the line. The points A and B refer to left and right ports of the line.

The total voltage on the line (Figure 3) is the summation of the incident diffusion component plus reflected diffusion components due to discontinuities at the source ($S$) and load ($L$). In other words, the time-domain expansion for total voltage is $$v_{Tot}(x,t) = v_I(x,t) + \sum_{i=1}^{\infty} v_{Ri}(x,t)$$

where $v_I(x,t)$ = voltage due to the incident diffusion and $v_{Ri}(x,t)$ = voltage due to the $i^{th}$ reflection. (In our notation, $R_i$ refers to $i^{th}$ reflected diffusion starting from either the source or the load discontinuity; $i$ basically represents the number of trips up and down the line.) Similarly, the total voltage in the transform domain is $$V_{Tot}(x,s) = V_I(x,s) + \sum_{i=1}^{\infty} V_{Ri}(x,s) .$$

In general, $v_{Ri}(x,t)$ can be calculated through convolution of the reflected diffusion taking into account position displacement, with the reflection coefficients $\Gamma_S(t)$ or $\Gamma_L(t)$. (Note that, e.g., $\Gamma_S(t) = L^{-1}\{\Gamma_S(s)\}$.)

Computation of response for reflected diffusion components

The reflection coefficient at the source in the transform domain is $\Gamma_s(s) = \frac{Z_s - z_o}{Z_s + Z_o}$, and the reflection coefficient at the load is $\Gamma_L(s) = \frac{Z_L - z_o}{Z_L + Z_o}$. The voltage at position $x$ (Figure 3)

due to the first reflection at the load can be calculated by considering the incident wave and shifting in position by $h + h - x = 2h - x$ and is given by $$V_{R_1}(x,s) = \Gamma_L(s)V_I(2h - x, s).$$

The corresponding time-domain expression is $$v_{R_1}(x,t) = \int_{\tau=0}^{t} \Gamma_L(t - \tau)v_I(2h - x, \tau)\, d\tau,$$

i.e., the first reflected voltage travels distance h to the end of the line before being reflected, then a further distance $h - x$ to reach the desired location. Another explanation for the reflection voltages is by applying the symmetry argument in the Method of Images (e.g., *Partial Differential Equations: Analytical Solution Techniques, J. Kevorkian*, Wadsworth & Brooks/ Cole, 1990) to satisfy the boundary condition at the end of the line $x = h$, as shown in Figure 4.

Similarly, the second reflection at the source yields $V_{R2}(x,s) = \Gamma_S(s)\Gamma_L(s)V_I(2h+x,s)$, and in general the $i^{th}$ reflection gives $$V_{R_i}(x,s) = \begin{cases} \Gamma_L^{\frac{i}{2}}(s)\Gamma_S^{\frac{i}{2}}(s)V_I(ih + x) & \text{for } i \text{ even} \\ \Gamma_L^{\frac{i+1}{2}}(s)\Gamma_S^{\frac{i-1}{2}}V_I(h(i+1) - x) & \text{for } i \text{ odd} \end{cases}$$

Substituting $I = 2n$ for even $i$, and $I = 2n - 1$ for odd $i$, we get $$\begin{aligned} V_{Tot}(x,s) &= V_I(x,s) + \sum_{i=1}^{\infty} V_{R_i}(x,s) \\ &= V_I(x,s) + \sum_{n=1}^{\infty} \left(\Gamma_L^n(s)\Gamma_S^{n-1}V_I(2nh - x, s) + \Gamma_L^n(s)\Gamma_S^n(s)V_I(2nh + x, s)\right) \end{aligned}$$

and the time-domain response is $$v_{Tot}(x,t) = v_I(x,t) + \sum_{n=1}^{\infty}[a_n(t) \otimes v_I(2nh-x,t) + b_n(t) \otimes v_I(2nh+x,t)]$$

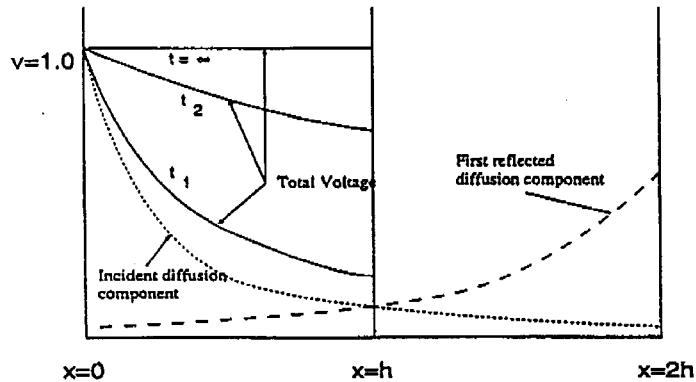

Figure 4: Evolution in time of the total voltage profile for a finite distributed RC line of length h. The small dotted line indicates the incident diffusion component and the large dotted line indicates the first reflection component. The total voltage on the line is equal to the sum of various diffusion components.

$$= v_I(x,t) + \sum_{n=1}^{\infty}\left[\int_{\tau=0}^{t} a_n(t-\tau)v_I(2nh-x,\tau)\,d\tau + \int_{\tau=0}^{t} b_n(t-\tau)v_I(2nh+x,\tau)\,d\tau\right] \tag{7}$$

where $a_n(t)$ and $b_n(t)$ represent odd and even $n^{th}$ reflection coefficient values. The total voltage at the end of the transmission line of length $l$ is $$v_{Tot}(h,t) = v_I(h,t) + \sum_{n=1}^{\infty}\left[\int_{\tau=0}^{t} a_n(t-\tau)v_I(h(2n-1),\tau)\,d\tau + \int_{\tau=0}^{t} b_n(t-\tau)v_I(h(2n+1),\tau)\,d\tau\right]$$

4 Example Embodiments for Step Input

4.1 A Simulation Model for Open-ended Finite RC Line

The finite-length, open-ended RC transmission line with ideal source has $Z_S = 0$ **(i.e., $\Gamma_{S_\infty} = -1$ and $\Gamma_S(t) = -\delta(t)$), and $Z_{L_\infty} \infty$ (i.e., $\Gamma_L(s) = 1$ and $\Gamma_L(t)$). The first reflected voltage is $$V_{R_1}(x,s) = \Gamma_L(s) V_I(2h - x, s) = V_I(2h - x, s)$$

and the corresponding time-domain response is $$v_{R_1}(x,t) = V_I(2h - x, t) = V_0 erfc\left(\sqrt{\frac{R_{2h-x} C_{2h-x}}{4t}}\right)$$

Similarly, the second reflected voltage is $V_{R_2}(x,s) = -V_I(2h+x,s)$ with time-domain response as $$v_{R_2}(x,t) = -V_0 erfc\left(\sqrt{\frac{R_{2h+x} C_{2h+x}}{4t}}\right)$$

In general, the $i^{th}$ reflection for even $i = 2n$ in the transform domain is $$V_{R_i}(x,s) = \Gamma_L^{\frac{i}{2}}(s)\Gamma_S^{\frac{i}{2}}(s) V_I(ih + x, s) = (-1)^n V_I(2nh + x, s),$$

the $i^{th}$ reflection for add $i = 2n - 1$ is $$V_{R_i}(x,s) = \Gamma_L^{\frac{i+1}{2}}(s)\Gamma_S^{\frac{i-1}{2}} V_I(h(i+1) - x, s) = (-1)^{n-1} V_I(2nh - x, s),\quad ]$$

and the respective time-domain responses are $$v_{R_n}(x,t) = \begin{cases} (-1)^n v_I(2nh+x,t) = (-1)^n erfc\left(\sqrt{\frac{R_{2nh+x}C_{2nh+x}}{4t}}\right) & \text{for even } n \\ (-1)^{n-1} v_I(2nh-x,t) = (-1)^{n-1} erfc\left(\sqrt{\frac{R_{2nh-x}C_{2nh-x}}{4t}}\right) & \text{for odd } n \end{cases}$$

Therefore, the total voltage is $$\begin{aligned} v_{Tot}(x,t) &= v_I(x,t) + \sum_{n=1}^{\infty} \left[(-1)^n v_I(2nh+x,t) + (-1)^{n-1} v_I(2nh-x,t)\right] \\ &= V_0 erfc\left(\sqrt{\frac{R_x C_x}{4t}}\right) \\ &\quad + V_0 \sum_{n=1}^{\infty} \left[(-1)^n erfc\left(\sqrt{\frac{R_{2nh+x}C_{2nh+x}}{4t}}\right) + (-1)^{n-1} erfc\left(\sqrt{\frac{R_{2nh-x}C_{2nh-x}}{4t}}\right)\right] \end{aligned}$$

(8)

4.2 A Simulation Model for Finite RC Line with Capacitive Load

The finite distributed $RC$ line of length h with capacitive load $C_L$ at the end of the line is shown in Figure 5.

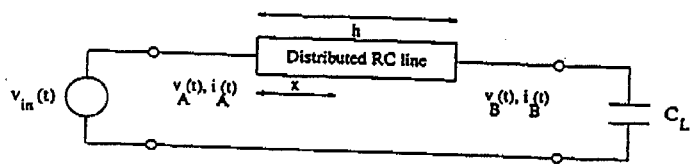

Figure 5: Distributed $RC$ line of length $h$ with capacitive load $C_L$.

Figure 5: Distributed RC line of length h with capacitive load $C_L$.

We will use the following shorthand quantities, which can be used to express the time-domain voltage response in a simple and concise form. Let $$L1(y,n,m) = \left(\left(\frac{C_h}{y}\right)^2 \frac{t}{R_h C_h} + \frac{(2nh+(-1)^m x)}{h}\frac{C_h}{y}\right)$$

$$L2(y,n,m) = \left(\frac{C_h}{y}\sqrt{\frac{t}{R_h C_h}} + \frac{(2nh+(-1)^m x)}{2h}\sqrt{\frac{R_h C_h}{t}}\right)$$

$$L3(y,n,m) = \left(\left(\frac{C_h}{y}\right)^2 \frac{2t}{R_h C_h} + \frac{(2nh+(-1)^m x)}{h}\frac{C_h}{y}\right)$$

where $y$ can be either $C_L$ or $R_S$ $n = 0,1,2,3...$, and $m = 0$ for an even reflection component and $m = 1$ for an odd reflection component of the response.

The reflection coefficient at the load for an impedance of $Z_L = \frac{1}{sC_L}$ is $$\Gamma_L(s) = \frac{Z_L - Z_0}{Z_L + Z_0} = \frac{1-q\sqrt{s}}{1+q\sqrt{s}}$$

where $q = C_L\sqrt{\frac{R_h}{C_h}} = \frac{C_L}{C_h}\sqrt{R_h C_h}$. From above, the reflection coefficient for an ideal source is $\Gamma_S(s) = \frac{Z_s - Z_0}{Z_s + Z_0} = -1$. The voltage response of the first reflected diffusion component at the load can be obtain from Equation (6):

$$V_{R_1}(x,s) = \Gamma_L V_I(2h-x,s)$$
$$= \frac{V_0}{s}\frac{1-q\sqrt{s}}{1+q\sqrt{s}}e^{-(2h-x)\sqrt{src}} = \frac{V_0}{s}\frac{1-q\sqrt{s}}{1+q\sqrt{s}}e^{-b\sqrt{s}}$$

where $b = \frac{(2h-x)}{h}\sqrt{R_h C_h}$ To compute the time-domain response we apply the following technique to invert the above Laplace transform response. Let $$F_1(s) = V_0\frac{(1-qs)}{s(1+qs)}e^{-bs} = V_0\left[\frac{1}{s} - \frac{2}{(s+1/q)}\right]e^{-bs}$$

Applying the inverse transform yield $$f_1(t) = V_0(1 - 2e^{-\frac{(t-b)}{a}})U(t-b)$$

where $U(t-b)$ is the step function which is $0$ for $t < b$ and $1$ for $t \geq b$. The inverse transform of this function with $\sqrt{s}$ as transform variable can be obtained using the identity $$\frac{F_1(\sqrt{s})}{\sqrt{s}} \Longleftrightarrow \frac{1}{\sqrt{\pi t}} \int_{x=0}^{\infty} e^{\frac{-x^2}{4t}} f_1(x)dx .$$

Expressing the voltage response $V_{R_1}(x,s)$ in terms of the function $F_1$, we get $$V_{R_1}(x,s) = \frac{F_1(\sqrt{s})}{\sqrt{s}}$$

and the corresponding time-domain response is $$\begin{aligned}(x,t) &= \frac{1}{\sqrt{\pi t}} \int_{x=0}^{\infty} e^{\frac{-x^2}{4t}} V_0(1 - 2e^{-\frac{(x-b)}{a}})U(x-b)dx \\ &= V_0 erfc\left(\frac{b}{\sqrt{4t}}\right) - 2V_0 e^{\left(\frac{t+b^2}{q^2}\right)} erfc\left(\frac{\sqrt{t}}{q} + \frac{b}{2\sqrt{t}}\right) \\ &= V_0 erfc\left(\frac{(2h-x)}{h}\sqrt{\frac{R_h C_h}{4t}}\right) - 2V_0 e^{L1(C_L,1,1)} erfc(L2(C_L,1,1))\end{aligned}$$

Similarly, the voltage response of the second reflected diffusion component (due to the source discontinuity with $\Gamma_s = -1$ is $\Gamma_L V_I(2h+x,s)$ and the corresponding time-domain response is $$v_{R_2}(x,t) = -V_0 erfc\left(\frac{(2h+x)}{h}\sqrt{\frac{R_h C_h}{4t}}\right) + 2V_0 e^{L1(C_L,1,0)} erfc(L2(C_L,1,0))$$

The voltage response of the third reflected diffusion component is $$v_{R_3}(x,t) = -V_0 \mathrm{erfc}\left(\frac{4h-x}{h}\sqrt{\frac{R_hC_h}{4t}}\right) + \frac{8V_0C_h}{\sqrt{\pi}C_L}\sqrt{\frac{t}{R_hC_h}}e^{(L1(C_L,2,1)-L2(C_L,2,1)^2)}$$
$$- 4V_0 L3(C_L,2,1)e^{L1(C_L,2,1)}\mathrm{erfc}(L2(C_L,2,1))$$

and the voltage response of the fourth reflected diffusion component is $$v_{R_4}(x,t) = V_0 \mathrm{erfc}\left(\frac{4h+x}{h}\sqrt{\frac{R_hC_h}{4t}}\right) - \frac{8V_0C_h}{\sqrt{\pi}C_L}\sqrt{\frac{t}{R_hC_h}}e^{(L1(C_L,2,0)-L2(C_L,2,0)^2)}$$
$$+ 4V_0 L3(C_L,2,0)e^{L1(C_L,2,0)}\mathrm{erfc}(L2(C_L,2,0))$$

If we approximate the total response by considering only up to these first four reflections, we have $$v_{Tot}(x,t) \approx v_I(x,t) + v_{R_1}(x,t) + v_{R_2}(x,t) + v_{R_3}(x,t) + v_{R_4}(x,t)$$

| Load factor ($\frac{C_L}{C_h}$) | 10% Threshold delays ($R_hC_h$) | | | 50% Threshold delays ($R_hC_h$) | | |
|---|---|---|---|---|---|---|
| | SPICE | Rao95 | Diff4L | SPICE | Rao95 | Diff4L |
| 0.0 | 0.133 | 0.130 | 0.131 | 0.376 | 0.379 | 0.379 |
| 0.25 | 0.180 | - | 0.182 | 0.560 | - | 0.563 |
| 0.5 | 0.220 | 0.220 | 0.221 | 0.736 | 0.739 | 0.740 |
| 1.0 | 0.289 | 0.287 | 0.287 | 1.088 | 1.089 | 1.085 |
| 2.0 | 0.405 | - | 0.403 | 1.795 | - | 1.811 |
| Load factor ($\frac{C_L}{C_h}$) | 63.2% Threshold delays ($R_hC_h$) | | | 90% Threshold delays ($R_hC_h$) | | |
| | SPICE | Rao95 | Diff4L | SPICE | Rao95 | Diff4L |
| 0.0 | 0.502 | 0.503 | 0.503 | 1.033 | 1.031 | 1.032 |
| 0.25 | 0.750 | - | 0.754 | 1.562 | - | 1.563 |
| 0.5 | 1.00 | 1.004 | 1.004 | 2.108 | 2.127 | 2.106 |
| 1.0 | 1.501 | 1.503 | 1.510 | 3.260 | 3.263 | 3.250 |
| 2.0 | 2.500 | - | 2.590 | 5.530 | - | 5.890 |

Table 1: A comparison of delay values at the end of the interconnect line (x = h) between SPICE, the method of [14] and the analytical expression computed using up to the first four reflected diffusion components.

We call the approximately of Equation (11) the Diff4L model (i.e., up to 4 reflected diffusions, with capacitive Loan impedance); Table 1 compares delay estimates at different threshold values for a wide range of capacitive loads, versus SPICE and the method of "Delay Analysis of the Distributed RC Line", V.B. Rao, Proc, *ACM/IEEE*

*Design Automation Conf.*, June 1995, pp. 370-375. Delay estimates from the new diffusion equation approach are very close to SPICE-computed delays, even though only four reflections are considered.

4.3 A Simulation Model for Finite *RC* Line with Resistive Source and Capacitive Load

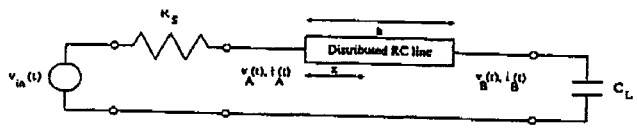

Figure 6: Distributed *RC* line of length $h$ with resistive source $R_S$ and capacitive load $C_L$.

Figure 6: Distributed *RC* line of length $h$ with resistive source $R_S$ and capacitive load $C_L$.

Finally, we consider a finite-length distributed *RC* line with both resistive source $R_s$ and capacitive loan $C_L$, as shown in Figure 6. The reflection coefficient at the source for an impedance of $Z_S = R_S$ is $$\Gamma_S(s) = \frac{Z_S - Z_0}{Z_S + Z_0} = -\frac{(1 - p\sqrt{s})}{(1 + p\sqrt{s})}$$

where $p = R_S \sqrt{\frac{C_h}{R_h}} = \frac{R_s}{R_h} \sqrt{R_h C_h}$. The reflection coefficient at the load is again given by Equation (10). The voltage response for the incident diffusion component at the beginning of the line (node A in Figure 6) is $V_A(s) = V_{in}(s) \frac{Z_0}{Z_0 + R_s}$. The voltage at node $A$ can be thought of as the effective input to the line. Considering a step input of magnitude $V_0$ and substituting for $Z_0 = \sqrt{\frac{R_h}{sC_h}}$, we get $$V_A(s) = \frac{V_0}{s}\frac{Z_0}{Z_0 + R_S} = \frac{V_0}{s(1+p\sqrt{s})} = \frac{F_3(\sqrt{s})}{\sqrt{s}}$$

where $F_3(s) = \frac{V_0}{s(1+ps)}$. The time-domain expression for the voltage at node $A$ is $$v_A(t) = \frac{1}{\sqrt{\pi t}} \int_{x=0}^{\infty} e^{-\frac{x^2}{4t}} f_3(x)dx = V_0\left[1 - e^{\frac{t}{p^2}}erfc\left(\frac{\sqrt{t}}{p}\right)\right]$$

Then, the voltage response for the first incident diffusion can be computed using Equation (4) and the input voltage at the beginning of the line, i.e., $$V_I(x,s) = V_A(s)e^{-\frac{x}{h}\sqrt{sR_hC_h}} = \frac{V_0}{s(1+p\sqrt{s})}e^{-\frac{x}{h}\sqrt{sR_hC_h}}.$$

The corresponding time-domain expression is $$\begin{aligned}v_I(x,t) &= V_0 erfc\left(\frac{x}{h}\sqrt{\frac{R_hC_h}{4t}}\right) \\ &\quad - V_0 e^{\left(\left(\frac{R_h}{R_S}\right)^2 \frac{t}{R_hC_h} + \frac{xR_h}{hR_S}\right)} erfc\left(\frac{R_h}{R_S}\sqrt{\frac{t}{R_hC_h}} + \frac{x}{2h}\sqrt{\frac{R_hC_h}{t}}\right) \\ &= V_0 erfc\left(\frac{x}{h}\sqrt{\frac{R_hC_h}{4t}}\right) - V_0 e^{L1(R_S,0,0)} erfc(L2(R_S,0,0))\end{aligned}$$

From this incident diffusion response and the reflection coefficient at the load, the voltage response of the first reflected diffusion component can be obtained as $$\begin{aligned}V_{R_1}(x,s) &= \Gamma_L V_I(2h - x, s) \\ &= \frac{V_0(1-q\sqrt{s})}{s(1+q\sqrt{s})(1+p\sqrt{s})}e^{-\frac{(2h-x)}{h}\sqrt{sR_hC_h}}\end{aligned}$$

To obtain the time-domain response, we consider the function $$F_i(s) = \frac{V_0(1-qs)}{s(1+qs)(1+ps)} e^{-bs}$$

where $b = \frac{-(2h-x)}{h}\sqrt{R_s C_k}$. Expanding the function using partial fractions and taking the inverse Laplace transform, we get $$f_i(t) = V_0\left[1 + \left(\frac{2q}{p-q}\right)e^{-(t-b)/q} - \left(\frac{p+q}{p-q}\right)e^{-(t-b)/p}\right] U(t-b)$$

The time-domain expression for this first reflected diffusion component is $$v_{R_1}(x,t) = V_0 erfc\left(\frac{2h-x}{h}\sqrt{\frac{R_s C_k}{4t}}\right)$$
$$+ \frac{2V_0 q}{p-q} e^{L1(C_L,1,1)} erfc(L2(C_L,1,1)) - V_0\left(\frac{p+q}{p-q}\right) e^{L1(R_s,1,1)} erfc(L2(R_s,1,1))$$

We can similarly calculate the time-domain expressions for the other reflected diffusion components. The second reflected diffusion component is given by $$V_{R_2}(x,s) = \frac{-V_0(1-q\sqrt{s})(1-p\sqrt{s})}{s(1+q\sqrt{s})(1+p\sqrt{s})^2} e^{-(2h+x)\sqrt{R_s C_k}}$$

and the corresponding time-domain expression is $$v_{R_2}(x,t) = -V_0 erfc\left(\frac{2h+x}{h}\sqrt{\frac{R_s C_k}{4t}}\right) + \frac{2V_0 q(p+q)}{(p-q)^2} e^{L1(C_L,1,2)} erfc(L2(C_L,1,0))$$
$$- \frac{V_0(q^2-p^2+4pq)}{(p-q)^2} e^{L1(R_s,1,2)} erfc(L2(R_s,1,0)) + \frac{4(p+q)}{p(p-q)}\sqrt{\frac{t}{\pi}} (e^{L1(R_s,1,0)} - e^{L1(R_s,1,0)})$$
$$- \frac{2(p+q)}{p(p-q)} L3(R_s,1,0) e^{L1(R_s,1,2)} erfc(L2(R_s,1,0))$$

Similarly, the voltage response of the third reflected diffusion component is $$v_{R_3}(x,t) = -V_0 erfc\left(\frac{4h-x}{h}\sqrt{\frac{R_s C_k}{4t}}\right) + \frac{4V_0 pq(2q+p)}{(p-q)^2} e^{L1(C_L,2,1)} erfc(L2(C_L,2,1))$$
$$- \frac{V_0(p+q)(q^2-p^2+8pq)}{(p-q)^2} e^{L1(R_s,2,1)} erfc(L2(R_s,2,1))$$
$$+ \frac{4(p+q)}{(p-q)^2}\sqrt{\frac{t}{\pi}} (e^{L1(C_L,2,1)} - e^{L1(C_L,2,1)}) - \frac{2(p+q)^2}{p(p-q)^2} L3(C_L,2,1) e^{L1(C_L,2,1)} erfc(L2(C_L,2,1))$$
$$+ \frac{2V_0(p+q)^2}{p(p-q)^2}\sqrt{\frac{t}{\pi}} (e^{L1(R_s,2,1)} - e^{L1(R_s,2,1)}) - \frac{2(p+q)^2}{p(p-q)^2} L3(R_s,2,1) e^{L1(R_s,2,1)} erfc(L2(R_s,2,1))$$

Of course, for this example we have derived expressions that are valid only when $p \neq q$; for the special case of $p = q$ each diffusion component must be reevaluated (see "A New reflection-Based Approach For RC Interconnect Analysis", A.B. Kahng and S. Muddu, UCLA Common Stock Dept. TR-950019, April 1995).

In general, the diffusion components need not be evaluated analytically, but instead can be computed by numerical integration methods.

5 Example Embodiments for Ramp Input

We now show how our method can be applied to compute the voltage response in distributed $RC$ lines under ramp input.

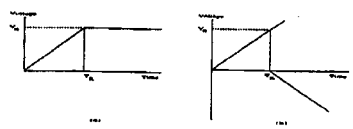

Figure 7: A ramp input function: (a) finite ramp with rise time $T_R$, and (b) finite ramp decomposed into two shifted infinite ramps.

We seek the response for a *finite* RC line under *finite* ramp input. For a semi-infinite RC line the total voltage on the line is due to only the incident diffusion component, i.e., the incident propagation of voltage. As with the previous example, we first solve the above diffusion equation for the semi-infinite line, then address the more general case where the total voltage response on the line is the sum of incident and reflected diffusion components. The initial and boundary conditions for the semi-infinite line under finite ramp input (see Figure 7) are IC: $v(x,0) = 0$ for all $x \geq 0$
BC1: $v(0,t) = v_{in}(t) = \frac{V_a}{T_R}[tU(t) - (t - T_R)U(t - T_R)]$ for all $t \geq 0$ where $U(t)$ denotes the step function.

Any finite ramp can be expressed as the sum of two shifted infinite ramps (see Figure 7); the time-domain response for a finite ramp can be derived from the infinite ramp response by a change of time variable. In the transform and time domains, we use $U(x,s)$ and $u(x,t)$ to respectively indicate the response for the infinite ramp input, and $V(x,t)$ and $v(x,t)$ to respectively indicate the response for the finite ramp input. Hence, the diffusion equation and new boundary conditions for infinite ramp response are:

$$rc\frac{\partial u(x,t)}{\partial t} = \frac{\partial^2 u(x,t)}{\partial x^2}$$

IC: $u(x,0) = 0$ for all $x \geq 0$
BC1: $u(0,t) = \frac{V_a}{T_R} \cdot t \cdot U(t)$ for all $t \geq 0$ The diffusion equation for step input has a boundary condition that is constant with respect to time. For a ramp input this boundary condition is a function of time, so it is difficult to derive the solution in the same way as for a step input. However, differentiating the diffusion equation in time and using the variable $w(x,t) = \frac{\partial u(x,t)}{\partial t}$, we again obtain a diffusion equation $$rc\frac{\partial w(x,t)}{\partial t} = \frac{\partial^2 w(x,t)}{\partial x^2}$$

with initial and boundary conditions obtained by taking the time derivative of the boundary conditions $u(x,t)$. The initial condition remains the same, but the boundary condition for the new diffusion equation becomes constant in time, i.e., similar to that for a step input:

$$\begin{aligned} IC: &\quad w(x,0) = 0 &\quad \text{for all } x \geq 0 \\ BC1: &\quad w(0,t) = \frac{V_0}{T_R}U(t) &\quad \text{for all } t \geq 0 \end{aligned}$$

The solution for the diffusion equation under step input can be obtained using the parabolic substitution of the variable $\eta = x\sqrt{\frac{rc}{2t}}$ (see Section 3) as $$w(\eta) = C_1 \int_0 e^{-\frac{y^2}{2}} dy + C_2$$

The initial condition $IC$ implies $C_1 = -\sqrt{\frac{2}{\pi}}C_2$. The boundary condition $BC1$, that at position $x = 0$ the derivative of voltage is constant and equal to $\frac{V_0}{T_R}$ for all $t > 0$, implies $C_2 = V_0$. Therefore, $$w(x,t) = \frac{V_0}{T_R}[1 - erf(\frac{\eta}{\sqrt{2}})] = \frac{V_0}{T_R} erfc\left(\frac{b}{\sqrt{4t}}\right).$$

***where $x$ is the position at which the response is calculated, and $b = \sqrt{R_x C_x} = x\sqrt{rc}$.

From this the incident diffusion component for the semi-infinite RC line under infinite ramp input, which we denote as $u_I(x,t)$, can be derived as $$\begin{aligned}u_I(x,t) &= \int_{\tau=0} w(x,\tau)d\tau \\ &= \int_{\tau=0}^{\tau=t} \frac{V_0}{T_R} erfc\left(x\sqrt{\frac{rc}{4\tau}}\right) d\tau \\ &= \frac{V_0}{T_R}\left[(t+\frac{b^2}{2})erfc(\frac{b}{\sqrt{4t}}) - b\sqrt{\frac{t}{\pi}}e^{-\frac{b^2}{4t}}\right] U(t) \\ &= \frac{V_0}{T_R}\left[(t+\frac{R_xC_x}{2})erfc(\sqrt{\frac{R_xC_x}{4t}}) - \sqrt{\frac{R_xC_xt}{\pi}}e^{-\frac{R_xC_x}{4t}}\right] U(t)\end{aligned}$$

Then, the time-domain response for the incident diffusion component $v_I(x,t)$ with a finite ramp input can be written in terms of the infinite ramp response:

$$\begin{aligned}v_I(x,t) &= u_I(x,t) - u_I(x,t-T_R) \\ &= \frac{V_0}{T_R}\left[(t+\frac{b^2}{2})erfc(\frac{b}{\sqrt{4t}}) - b\sqrt{\frac{t}{\pi}}e^{-\frac{b^2}{4t}}\right] U(t) \\ &\quad - \frac{V_0}{T_R}\left[(t-T_R+\frac{b^2}{2})erfc(\frac{b}{\sqrt{4(t-T_R)}}) + b\sqrt{\frac{(t-T_R)}{\pi}}e^{-\frac{b^2}{4(t-T_R)}}\right] U(t-T_R) \quad (15)\end{aligned}$$

As expected, the second term in the above equation is zero $t \leq T_R$, so the finite ramp response is given by Equation 914) for $t \leq T_R$ and by Equation (15) for $t \leq T_R$. The response in the transform domain for the incident diffusion component is where $V_{in}(s)$ represents the finite ramp input.

5.1 A Simulation Model for Open-Ended Finite $RC$ Line

Proceeding from Equations (14) and (15), the time-domain response of incident diffusion component for the infinite ramp can be expressed in terms of the line time constant $R_h C_h$ as $$u_I(x,t) = \frac{V_0}{T_R}\left[(t + \frac{b^2}{2})erfc(\frac{b}{\sqrt{4t}}) - b\sqrt{\frac{t}{\pi}}e^{-\frac{b^2}{4t}}\right]U(t)$$

$$= \frac{V_0}{T_R}\left[(t + \frac{x^2}{2h^2}R_h C_h)erfc(\frac{x}{h}\sqrt{\frac{R_h C_h}{4t}}) - \frac{x}{h}\sqrt{\frac{R_h C_h t}{\pi}}e^{-(\frac{x}{h})^2\frac{R_h C_h}{4t}}\right]U(t)$$

where $b = \sqrt{R_x C_x} = \frac{x}{h}\sqrt{R_h C_h}$. Hence, the time-domain response of the incident diffusion component for the finite ramp is $$v_I(x,t) = \frac{V_0}{T_R}\left[(t + \frac{b^2}{2})erfc(\frac{b}{\sqrt{4t}}) - b\sqrt{\frac{t}{\pi}}e^{-\frac{b^2}{4t}}\right]U(t)$$

$$- \frac{V_0}{T_R}\left[(t - T_R + \frac{b^2}{2})erfc(\frac{b}{\sqrt{4(t-T_R)}}) + b\sqrt{\frac{(t-T_R)}{\pi}}e^{-\frac{b^2}{4(t-T_R)}}\right]U(t - T_R) \quad (17)$$

Since all the coefficients of reflection are constants for an open-ended line with an ideal source, the total response can be computed from the incident diffusion component via shifts in the time variable, i.e., the total response in the transform domain is $$V_{Tot}(x,s) = V_I(x,s) + \sum_{n=1}^{\infty}\left[\Gamma_L^n(s)\Gamma_S^{n-1}(s)V_I(2nh - x,s) + \Gamma_L^n(s)\Gamma_S^n(s)V_I(2nh + x,s)\right]$$

$$= V_I(x,s) + \sum_{n=1}^{\infty}\left[(-1)^{n-1}V_I(2nh - x,s) + (-1)^n V_I(2nh + x,s)\right]$$

and the corresponding time-domain expression is $$v_{Tot}(x,t) = v_I(x,t) + \sum_{n=1}^{\infty}\left[(-1)^{n-1}v_I(2nh - x,t) + (-1)^n v_I(2nh + x,t)\right]$$

where $V_I(x,s)$ and $v_I(x,t)$ represent the incident diffusion per Equations (16) and (17).

5.2 A Simulation Model for Finite RC Line with Capacitive Load

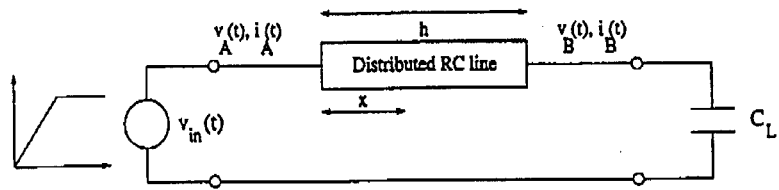

Figure 8: Distributed RC line of length $h$ with capacitive $C_L$.

Incident Diffusion. The first component of the total response is the incident diffusion voltage, derived in Equations (14) and (15):

$$u_I(x,t) = \frac{V_0}{T_R}\left[(t+\frac{b^2}{2})erfc(\frac{b}{\sqrt{4t}}) - b\sqrt{\frac{t}{\pi}}e^{-\frac{b^2}{4t}}\right]U(t)$$

$$v_I(x,t) = \frac{V_0}{T_R}\left[(t+\frac{b^2}{2})erfc(\frac{b}{\sqrt{4t}}) - b\sqrt{\frac{t}{\pi}}e^{-\frac{b^2}{4t}}\right]U(t)$$

$$- \frac{V_0}{T_R}\left[(t-T_R+\frac{b^2}{2})erfc(\frac{b}{\sqrt{4(t-T_R)}}) + b\sqrt{\frac{(t-T_R)}{\pi}}e^{-\frac{b^2}{4(t-T_R)}}\right]U(t-T_R) \quad (17)$$

Diffusion components for reflections are computed by multiplying the reflection coefficients with the incident diffusion response in the transform domain as described in Section 3.

First Reflection. The reflection coefficient at the loan for a loan impedance $Z_L = \frac{1}{sC_L}$ is $$\Gamma_L(s) = \frac{Z_L - Z_0}{Z_L + Z_0} = \frac{1 - q\sqrt{s}}{1 + q\sqrt{s}}$$

where $q = C_L\sqrt{\frac{R_h}{C_h}} = \frac{C_L}{C_h}\sqrt{R_h C h}$. The voltage response of the first reflected diffusion can be obtained from Equation (7);

$$V_{R_1}(x,s) = \Gamma_L V_I(2h - x, s)$$
$$= \frac{V_0}{T_R s^2}(1 - e^{-sT_R})\frac{1 - q\sqrt{s}}{1 + q\sqrt{s}}e^{-\frac{(2h-x)}{h}\sqrt{sR_h C_h}}$$

The infinite ramp input response is $$U_{R_1}(x,s) = \frac{V_0}{T_R s^2}\frac{1 - q\sqrt{s}}{1 + q\sqrt{s}}e^{-\frac{(2h-x)}{h}\sqrt{sR_h C_h}} = \frac{V_0}{T_R s^2}\frac{1 - q\sqrt{s}}{1 + q\sqrt{s}}e^{-b\sqrt{s}}$$

where $b = \frac{(2h-x)}{h}\sqrt{R_h C_h}$. To compute the time-domain response we express the response in the transform domain in the form $\frac{F(\sqrt{s})}{\sqrt{s}}$. Let $$F_1(s) = \frac{V_0}{T_R s^3}\frac{1 - qs}{1 + qs}e^{-bs} = \frac{V_0}{T_R}\left[\frac{1}{s^3} - \frac{2q}{s^2} + \frac{2q^2}{s} - \frac{2q^2}{(s + 1/q)}\right]e^{-bs}$$

The response in the transform domain can be expressed as $$U_{R_1}(x,s) = \frac{F(\sqrt{s})}{\sqrt{s}} = \frac{V_0}{T_R}\left[\frac{1}{s^2} - \frac{2q}{s^{3/2}} + \frac{2q^2}{s} - \frac{2q^2}{\sqrt{s}(\sqrt{s} + 1/q)}\right]e^{-b\sqrt{s}}$$

The inverse transform for $U_{R_1}(x,s)$ can be computed by inverting each term of the above equation, so the time-domain response for the first reflected diffusion is $$u_{R_1}(x,t) = \frac{V_0}{T_R}\left[(t+\frac{b^2}{2})erfc(\frac{b}{\sqrt{4t}}) - b\sqrt{\frac{t}{\pi}}e^{-\frac{b^2}{4t}} - 4q\sqrt{\frac{t}{\pi}}e^{-\frac{b^2}{4t}} + 2qberfc\left(\frac{b}{\sqrt{4t}}\right)\right.$$
$$\left. + 2q^2 erfc\left(\frac{b}{\sqrt{4t}}\right) - 2q^2 e^{\left(\frac{t+qb}{q^2}\right)}erfc\left(\frac{\sqrt{t}}{q}+\frac{b}{2\sqrt{t}}\right)\right]U(t) \quad (18)$$

Thus, for a finite ramp input the time-domain response is given by $$v_{R_1}(x,t) = u_{R_1}(x,t) - u_{R_1}(x, t-T_R)$$

Second Reflection. The voltage response of the second reflected diffusion component due to the source discontinuity with $\Gamma_S(s) = \frac{Z_S - Z_o}{Z_S + Z_0}$ is given by $$V_{R_2}(x,s) = \Gamma_S \Gamma_L V_I(2h+x,s) = -\Gamma_L V_I(2h+x,s).$$

The time-domain response for infinite ramp input can be calculated from the first reflected diffusion component as $$u_{R_2}(x,t) = \frac{V_0}{T_R}\left[-(t+\frac{b^2}{2})erfc(\frac{b}{\sqrt{4t}}) + b\sqrt{\frac{t}{\pi}}e^{-\frac{b^2}{4t}} + 4q\sqrt{\frac{t}{\pi}}e^{-\frac{b^2}{4t}} - 2qberfc\left(\frac{b}{\sqrt{4t}}\right)\right.$$
$$\left. - 2q^2 erfc\left(\frac{b}{\sqrt{4t}}\right) + 2q^2 e^{\left(\frac{t+qb}{q^2}\right)}erfc\left(\frac{\sqrt{t}}{q}+\frac{b}{2\sqrt{t}}\right)\right]U(t) \quad (19)$$

where $b = \frac{(2h+x)}{h}\sqrt{R_h C_h}$, whence the time-domain response under finite ramp input is $$v_{R_2}(x,t) = u_{R_2}(x,t) - u_{R_2}(x, t-T_R).$$

Third Reflection. The infinite ramp input response for the third reflected diffusion component is $$u_{R_3}(x,t) = \frac{1}{\sqrt{\pi t}} \int_{x=0}^{\infty} e^{\frac{-x^2}{4t}} f_4(x) dx$$

$$= \frac{4q}{\sqrt{\pi t}} \int_{x=0}^{\infty} e^{\frac{-x^2}{4t}}(x-b)e^{-\frac{(x-b)}{q}} dx$$

$$= 8q\sqrt{\frac{t}{\pi}} e^{\left(-(\frac{\sqrt{t}}{q}+\frac{b}{2\sqrt{t}})^2 + \frac{(t+qb)}{q^2}\right)} - 4q(\frac{2t}{q}+b)e^{\frac{(t+qb)}{q^2}} erfc\left(\frac{\sqrt{t}}{q}+\frac{b}{2\sqrt{t}}\right)$$

where $b = \frac{(4h-x)}{h}\sqrt{R_k C_k}$. The infinite ramp input response for third reflected diffusion component is $$vR_3(x,t) = uR_3(x,t-T_R)$$

Fourth Reflection. The infinite ramp input response for the fourth reflected diffusion component is $$u_{R_4}(x,t) = \frac{V_0}{T_R} \left[ (t+\frac{b^2}{2}) erfc(\frac{b}{\sqrt{4t}}) - b\sqrt{\frac{t}{\pi}} e^{-\frac{b^2}{4t}} - 8q\sqrt{\frac{t}{\pi}} e^{-\frac{b^2}{4t}} + 4qb \, erfc\left(\frac{b}{\sqrt{4t}}\right) \right]$$

| Load factor $(\frac{C_L}{C_k})$ | 10% Threshold delays($R_k C_k$) | | 50% Threshold delays ($R_k C_k$) | |
|---|---|---|---|---|
| | SPICE | Diff4 | SPICE | Diff4 |
| 0.0 | 6.20 | 6.30 | 14.20 | 14.25 |
| 0.25 | 7.60 | 7.70 | 16.90 | 16.85 |
| 0.5 | 8.70 | 8.80 | 19.35 | 19.30 |
| 1.0 | 10.50 | 10.50 | 24.30 | 24.25 |
| 2.0 | 13.10 | 13.15 | 34.20 | 33.50 |
| 5.0 | 18.50 | 17.55 | 64.00 | 56.00 |
| Load factor $(\frac{C_L}{C_k})$ | 63.2% Threshold delays($R_k C_k$) | | 90% Threshold delays($R_k C_k$) | |
| | SPICE | Diff4 | SPICE | Diff4 |
| 0.0 | 16.50 | 16.50 | 24.75 | 24.70 |
| 0.25 | 19.75 | 19.70 | 32.00 | 30.00 |
| 0.5 | 23.30 | 23.30 | 40.00 | 38.90 |
| 1.0 | 30.50 | 30.60 | 57.50 | 57.75 |
| 2.0 | 45.10 | 44.70 | 92.00 | 99.00 |
| 5.0 | 89.50 | 80.00 | 199.00 | 235.00 |

Table 2: Comparison of delay values at the end of the interconnection line ($x = h$), between the SPICE URC model and the DIff4 analytical expression computed using diffusion analysis up to the first four reflection components. The input rise time is assumed equal to the line time constant, i.e., $T_R = R_h C_h = 15$ psec.

$$+ 8q^2 erfc\left(\frac{b}{\sqrt{4t}}\right) - 8q^2 e^{\left(\frac{t+qb}{q^2}\right)} erfc\left(\frac{\sqrt{t}}{q} + \frac{b}{2\sqrt{t}}\right)$$
$$- 8\sqrt{\frac{t}{\pi}} e^{\left(-(\frac{\sqrt{t}}{q} + \frac{b}{2\sqrt{t}})^2 + \frac{(t+qb)}{q^2}\right)} + 4(2t + qb) e^{\frac{(t+qb)}{q^2}} erfc\left(\frac{\sqrt{t}}{q} + \frac{b}{2\sqrt{t}}\right)\Big] U(t) \quad (20)$$

where $b = \frac{(4h+x)}{h}\sqrt{R_h C_h}$. The finite ramp response for fourth reflected diffusion component is $$v_{R_4}(x,t) = u_{R_4}(x,t) - u_{R_4}(x, t - T_R).$$

If we approximate the total response for infinite ramp input by considering only up to these first four reflections, we have $$u_{Tot}(x,t) \approx u_I(x,t) + u_{R_1}(x,t) + u_{R_2}(x,t) + u_{R_3}(x,t) + u_{R_4}(x,t) \quad (21)$$

and the total response for the finite ramp input is $$v_{Tot}(x,t) = u_{tot}(x,t) - u_{Tot}(x, t - T_R)$$
$$\approx [v_I(x,t) + v_{R_1}(x,t) + v_{R_2}(x,t) + v_{R_3}(x,t) + v_{R_4}(x,t)]$$

We call the approximation of Equation (22) the Diff4 model. Table 5.2 compares Diff4 delay estimates at different threshold values for a wide range of capacitive loads, versus the SPICE URC (Uniform Distributed RC) model. As before, the delay estimates using our new diffusion equation approach are very close to the SPICE-computed delays, even though only four reflections are considered.

1. A computer-implemented simulation method for determining the response to an input signal of a continuous and distributed transmission line having an impedance, comprising:

determining applicable boundary conditions to represent said transmission line introducing applicable impedances;

providing a representation of the input signal; and applying specified solutions to a diffusion equation to said input signal representation, impedances and boundary conditions, to determine said response, wherein applying specified solutions comprises:

determining a time-domain response of a semi-infinite RC line for step and ramp inputs;

determining a time-domain response for a finite RC line with general load and source impedances by summing distinct diffusions starting at both ends of the finite RC line, the RC line have a source and load end of the line; and recursively determining higher order diffusion components due to reflections at the source and load ends of the finite RC line.

12. The method as recited in Claim 1, wherein said transmission line comprises a circuit interconnect.

13. The method as recited in Claim 1, wherein said response is determined in respect to a plutality of interconnected transmission lines.

14. The method as recited in Claim 13, wherein applying specified solutions to the diffusion equation to said input signal representation comprises modeling reflection coefficients in respect to at least one impedance discontinuity.

15. The method as recited in Claim 14, where applying specified solutions to the diffusion equation to said input signal representation comprises modeling reflection coefficients in respect to a plurality of impedance discontinuities.

16. A computer-implemented simulation method for determining the response, to an input signal, of t least one continuous and distributed transmission line having an impedance, comprising:

simulating the input signal with a linear combination of steps and ramps;

determining applicable boundary conditions for the continuous and distributed transmission line;

providing applicable source and load impedances for the continuous and distributed transmission line;

applying specified solutions to diffusion equations for the continuous and distributed transmission line to calculate, from said boundary conditions and 11    said source and load impedances, the incident voltage and reflections in a 12    selected number or orders; and 13    summing the incident voltage and each of said orders of reflection to 14    determine said response from said input signal.

15

1    17.    The method as recited in Claim 16, wherein applying specified 2    solutions to diffusion equations for the continuous and distributed transmission 3    line is conducted in a transform domain, and further comprising inversely 4    transforming said response to the time domain.

5

1    19.    The method as recited in Claim 16, wherein said method is applied 2    to a plurality of successive finite continuous and distributive transmission lines to 3    determine the response therefrom comprising:

4    simulating the input signal to the first said element;

5    determining appropriate boundary conditions in respect to the first said 6    element;

7    providing applicable impedances for the first said element;

8    applying specified solutions to the diffusion equation to said boundary 9    conditions and said impedances, to calculate the incident voltage and 10    reflections in a selected number of orders in respect to the first said element;

11    summing the incident voltage and each of said orders of reflection to 12    determine said response from said input signal; and 13   replacing said input signal simulation by said response; and 14   repeating the steps of determining, providing, applying, summing and 15   replacing in respect to each successive finite continuous and distributive RC 16   transmission line.

17

1    20.   An apparatus for determining the response, to an input signal, of at 2    least one finite continuous and distributive RC transmission line having an 3    impedance, said apparatus comprising a programmed computer, said 4    programmed computer comprising:

5    first means to provide applicable boundary conditions to represent said finite 6    continuous and distributive RC transmission line;

7    second means to provide a representation of the input signal as a linear 8    combination of steps and ramp signals;

9    third means to provide applicable impedances for the finite contiinuous and 10   distributive RC transmission line; and 11   fourth means, responsive to said first, second and third means, to determine 12   sand response by application of specified solutions of a diffusion equation for 13   the finite continuous and distributive RC transmission line given said input 14   signal representation, said impedances and said boundary conditions.

15

We claim:

1. A computer-implemented simulation method for determining the response to an input signal of a continuous and distributed transmission line having an impedance, comprising:

determining applicable boundary conditions to represent said transmission line;

introducing applicable impedances;

providing a representation of the input signal; and applying specified solutions to a diffusion equation to said input signal representation, impedances and boundary conditions, to determine said response, wherein applying specified solutions comprises:

determining a time-domain response of a semi-infinite RC line for step and ramp inputs;

determining a time-domain response for a finite RC line with general load and source impedances by summing distinct diffusions starting at both ends of the finite RC line, the finite RC line have a source and load end of the line; and recursively determining higher order diffusion components due to reflections at the source and load ends of the finite RC line.

2. The method as recited in claim 1, wherein said transmission line comprises a circuit interconnect.

3. The method as recited in claim 1, wherein said response is determined in respect to a plurality of interconnected transmission lines.

4. The method as recited in claim 3, wherein applying specified solutions to the diffusion equation to said input signal representation comprises modeling reflection coefficients in respect to at least one impedance discontinuity.

5. The method as recited in claim 4, wherein applying specified solutions to the diffusion equation to said input signal representation comprises modeling reflection coefficients in respect to a plurality of impedance discontinuities.

6. A computer-implemented simulation method for determining the response, to an input signal, of at least one continuous and distributed transmission line having an impedance, comprising:

simulating the input signal with a linear combination of steps and ramps;

determining applicable boundary conditions for the continuous and distributed transmission line;

providing applicable source and load impedances for the continuous and distributed transmission line;

applying specified solutions to diffusion equations for the continuous and distributed transmission line to calculate, from said boundary conditions and said source and load impedances, the incident voltage and reflections in a selected number or orders; and summing the incident voltage and each of said orders of reflection to determine said response from said input signal.

7. The method as recited in claim 6, wherein applying specified solutions to diffusion equations for the continuous and distributed transmission line is conducted in a transform domain, and further comprising inversely transforming said response to the time domain.

8. The method as recited in claim 7, wherein said step of applying is conducted in the Laplace domain.

9. The method as recited in claim 6, wherein said method is applied to a plurality of successive finite continuous and distributive transmission lines to determine the response therefrom, comprising:

simulating the input signal to the first said element;

determining appropriate boundary conditions in respect to the first said element;

providing applicable impedances for the first said element;

applying specified solutions to the diffusion equation to said boundary conditions and said impedances, to calculate the incident voltage and reflections in a selected number of orders in respect to the first said element;

summing the incident voltage and each of said orders of reflection to determine said response from said input signal; and replacing said input signal simulation by said response; and repeating the steps of determining, providing, applying, summing and replacing in respect to each successive finite continuous and distributive RC transmission line.

10. An apparatus for determining the response, to an input signal, of at least one finite continuous and distributive RC transmission line having an impedance, said apparatus comprising a programmed computer, said programmed computer comprising:

first means to provide applicable boundary conditions to represent said finite continuous and distributive RC transmission line;

second means to provide a representation of the input signal as a linear combination of step and ramp signals;

third means to provide applicable impedances for the finite continuous and distributive RC transmission line; and fourth means, responsive to said first, second and third means, to determine said response by application of specified solutions of a diffusion equation for the finite continuous and distributive RC transmission line given said input signal representation, said impedances and said boundary conditions.

* * * * *